United States Patent
Dorfman

(10) Patent No.: US 8,329,772 B2
(45) Date of Patent: Dec. 11, 2012

(54) UV-CURABLE POLYMER THICK FILM DIELECTRIC COMPOSITIONS WITH EXCELLENT ADHESION TO ITO

(75) Inventor: Jay Robert Dorfman, Durham, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 182 days.

(21) Appl. No.: 12/783,948

(22) Filed: May 20, 2010

(65) Prior Publication Data

US 2011/0288197 A1 Nov. 24, 2011

(51) Int. Cl.
- C08F 2/46 (2006.01)
- C08F 2/50 (2006.01)
- C08J 3/28 (2006.01)
- H01B 3/30 (2006.01)
- H01B 3/00 (2006.01)
- H01B 3/02 (2006.01)

(52) U.S. Cl. ......... 522/82; 522/74; 522/76; 522/77; 522/96; 522/90; 522/113; 522/114; 522/120; 522/121; 522/151; 522/152; 522/173; 174/137 R; 174/137 B; 524/541; 264/290.2

(58) Field of Classification Search ........... 522/74, 522/76, 77, 82, 96, 90, 113, 114, 120, 121, 522/151, 152, 173, 174; 174/137 B; 524/541; 264/290.2

See application file for complete search history.

(56) References Cited

U.S. PATENT DOCUMENTS

| | | | |
|---|---|---|---|
| 4,613,560 A | | 9/1986 | Dueber et al. |
| 5,128,387 A | * | 7/1992 | Shustack .................... 522/92 |
| 6,517,901 B1 | * | 2/2003 | Minami et al. ............. 427/226 |
| 2005/0101685 A1 | * | 5/2005 | Krohn ......................... 522/71 |
| 2005/0179367 A1 | * | 8/2005 | Krohn et al. .............. 313/503 |
| 2007/0128376 A1 | | 6/2007 | Harada et al. |
| 2008/0114089 A1 | * | 5/2008 | Krohn ......................... 522/30 |
| 2008/0200577 A1 | | 8/2008 | Spyrou et al. |
| 2009/0301561 A1 | | 12/2009 | Wang et al. |

FOREIGN PATENT DOCUMENTS

JP 55021157 A * 2/1980

OTHER PUBLICATIONS

International Search Report Dated August 5, 2011 for International Application No. PCT/US2011/036901.

* cited by examiner

*Primary Examiner* — Sanza McClendon

(57) ABSTRACT

This invention provides a screen printable dielectric composition comprising finely divided particles of talc dispersed in a curable liquid composition containing an acrylated urethane resin oligomer, an alkyl acrylate, and phosphoric acid.

11 Claims, No Drawings

UV-CURABLE POLYMER THICK FILM DIELECTRIC COMPOSITIONS WITH EXCELLENT ADHESION TO ITO

FIELD OF THE INVENTION

The invention is directed to a curable dielectric composition comprising talc and phosphoric acid adhesive agents and to the use of such compositions on indium tin oxide-coated substrates.

TECHNICAL BACKGROUND OF THE INVENTION

In an assembled electrical circuit, dielectric failure can lead to either electrical or physical breakdown of the circuit. Both materials vendors and circuit manufacturers rigorously test components under fresh and accelerated conditions to decrease the probability of this occurrence. A basic type of electrical failure is the loss of adhesion of the dielectric composition to the underlying substrate. Without acceptable adhesion, the material is not suitable for reliable use.

Adhesive loss is a difficult problem since it is intimately related to the substrate. The problem is compounded by the large number of available substrates. While polyester films are the most widely used in touch switches, polycarbonate and polyimide films are also used. Each film manufacturer typically offers several grades of each product, with different surface characteristics due to variable processing techniques and/or surface pretreatments. The films may also be given a heat treatment to reduce shrinkage in later curing steps.

The common substrate for printed silver and dielectric compositions in touch screen displays and thin-film photovoltaic cells is typically indium tin oxide (ITO) deposited on top of a polyester or glass substrate. A common method for deposition of the ITO is sputtering. Other metal oxides such as zinc oxide may be used in place of ITO although ITO is the most widely used metal oxide of its type. ITO is used quite often because of its ability to function as an optically clear conductive phase. However, ITO has a very low surface energy. Thus, it is very difficult to have printed compositions adhere to the ITO surface.

In practice, most manufacturers first select a conductive ink, and then look for a compatible dielectric. The selection is especially critical in touch screen display and thin-film photovoltaic cell applications since the dielectric is used both to insulate the conductor and to encapsulate it to prevent environmental damage. Lack of adequate adhesion of the dielectric to the substrate and/or to the conductive ink has resulted in limited market penetration for many dielectric compositions, especially those which are ultraviolet (UV) curable.

Existing manufacturing processes dictate that the dielectric be screen-printable and either thermally curable or UV light curable. Faster cures can be obtained with the UV curing and the wide availability of UV curing units makes this a more cost-effective and practical route. The dielectric composition must be compatible with the conductive ink and must meet certain other performance standards. It must cure to a flexible, abrasion-resistant film, with good adhesion to the substrate and to the conductive ink. Crossover applications also require that the conductive ink have good adhesion to the dielectric and, frequently, good adhesion of the dielectric to itself. Electrical requirements call for a low dielectric constant, high insulation resistance and high breakdown voltage. The physical and electrical properties must not degrade under a variety of environmental conditions.

The most widely accepted criterion for measuring the adhesion of polymer thick film materials is the tape test described by ASTM D3359-78, Method B. For films under 5 mils thickness, it requires that a 10×10 grid 30 pattern be made with a sharp cutting instrument through the cured ink to the surface of the substrate. A device for this purpose is available from the Gardner/Neotec Instrument Division of Pacific Scientific. A pressure-sensitive tape, such as 3M Scotch® Brand 600, is applied over the grid pattern and then removed with a continuous, nonjerking motion. Depending on the extent of ink removal, the adhesion is rated from OB to 5 B, the highest rating representing no ink removal.

Many of the inks which fail this Crosshatch test nevertheless exhibit acceptable adhesion in a simple tape pull test. This implies that adhesion loss is due to delamination of the ink from the substrate due to the excess energy imparted to the ink during the cutting operation. Unless this energy can be stopped from traveling laterally across the ink substrate interface, these inks will give poor Crosshatch adhesion. It is frequently observed that inks with nominal Crosshatch adhesion pass or fail depending on the type of cutting pattern; few cuts widely spaced impart less energy than several cuts close together on the same unit area. The ASTM test described above is designed to make Crosshatch testing more reproducible by quantifying the transverse forces applied in any particular situation.

To survive the stress of crosshatching, polymeric inks need to be toughened so that the applied forces are absorbed or dissipated in the vicinity of the cuts and are thus prevented from traveling to the ink substrate interface. One way of doing this is to increase the degree of crosslinking. This technique can be counterproductive in that the resulting composition may become too brittle for a touch panel ink. Another method is to use filler particles such as talc. While this improves adhesion to some extent, it does not provide enough adhesion for an ITO surface. There is a continuing need for a screen-printable, UV curable dielectric composition that provides good adhesion to ITO substrate surfaces.

SUMMARY OF THE INVENTION

The invention provides a screen printable, curable dielectric composition having superior adhesion to a wide variety of ITO substrates, the dielectric composition comprising:
  a) 25 to 35 wt % finely divided talc particles; and
  b) a liquid component comprising:
    (1) 20 to 50 wt % acrylated urethane resin oligomer;
    (2) 15 to 40 wt % alkyl acrylate; and
    (3) 1 to 5 wt % phosphoric acid,
wherein the talc particles are dispersed in the liquid component and wherein the wt % are based on the total weight of the dielectric composition.

In a second aspect, the invention is directed to the above composition which has been cured to form a continuous solid phase of acrylated urethane resin oligomer having dispersed therein finely divided particles of talc.

In a third aspect, the invention is directed to touch screen panels comprising upper and lower layers having facing electrically conductive areas separated by an adherent spacer layer of the cured above-described composition.

In yet another aspect, the invention is directed to touch screen panels comprising upper and lower layers having facing electrically conductive areas separated by an adherent spacer layer and having electrically conductive traces leading there from encapsulated within a layer of the cure above-described composition.

In a still further aspect, the invention is directed to a thin-film photovoltaic cell comprising upper and lower layers, at least one of which layers has a plurality of overlying electrically conductive areas, each separated from the other by a layer of the cured above-described composition.

DETAILED DESCRIPTION OF THE INVENTION

The invention is directed to a curable dielectric composition that contains both talc and phosphoric acid and has excellent adhesion to a wide variety of ITO surfaces. As used herein, the terms "curing" and "crosslinking" refer to the hardening of the liquid polymers which results from polymerization and/or crosslinking. By the appropriate choice of free radical initiators, curing can be initiated by UV light or by the action of heat. Compositions which are curable by the action of UV light are advantageous. The selection of such initiators and initiation systems is well within the skill of the art. For example, a discussion of photo initiators is given in Dueber et al, U.S. Pat. No. 4,615,560.

All wt % are based on the total weight of the dielectric composition.

A. Inorganic Adhesion Agents

While the prior art indicates that a wide variety of materials would function effectively, it has been found that the composition of the inorganic additives which can be used is quite critical. Only a combination of talc and phosphoric acid have been found to be effective to attain a high degree of adhesion.

At least 25 wt % of the talc is required to obtain the desired level of adhesion for the compositions of the invention. However, more than about 35 wt % of this adhesive agent is detrimental in that the cured composition may become too inflexible. The 25 to 35 wt % of talc used in the dielectric composition is based on the total weight of the dielectric composition.

Phosphoric acid is the other adhesive agent and is part of the UV-curable liquid component. It is present in amounts of from about 1 wt % to about 5 wt %, based on the total weight of the dielectric composition. In another embodiment the phosphoric acid is present in amounts of from about 1.5 wt % to about 2.5 wt %. Approximately 2.0 wt % phosphoric acid is optimal for adhesion to ITO.

B. Urethane Resin Oligomer

An essential ingredient of the curable liquid component of the invention and the primary rubbery material is the acrylated urethane resin oligomer. The acrylated urethane resin oligomer constitutes 20 to 50 wt %, based on the total weight of the dielectric composition. In some embodiments it constitutes 30 to 40 wt %.

C. Alkyl Acrylates

Alkyl acrylates constitute an important part of the curable liquid component of the invention. In all cases, the alkyl acrylates must be liquid at room temperature. Both mono- and multi-functional acrylates can be used in the invention. However, the amount of tri- and higher functionality acrylates must be limited to 10 wt % or less in order to avoid excessive crosslinking and shrinkage of the composition. It is therefore desirable to employ only mono- and di-functional liquid alkyl acrylates in an amount of 15 to 40 wt %, based on the total weight of the dielectric composition. Other embodiments contain 20 to 30 wt % alkyl acrylates.

Suitable alkyl acrylates include but are not limited to acrylates and the corresponding methacrylates in the following list: alkyl acrylate, tetrahydrofurfuryl acrylate, triethyleneglycol diacrylate, ethyleneglycol diacrylate, polyethyleneglycol diacrylate, 1,3-butyleneglycol diacrylate. 1,4-butanediol diacrylate, diethyleneglycol diacrylate, 1,6-hexanediol diacrylate, neopentylglycol diacrylate, 2-(2-ethoxyethoxy)ethyl acrylate, tetraethyleneglycol diacrylate, pentaerythritol tetraacrylate, 2-phenoxyethyl acrylate, ethoxylated bisphenol A diacrylate, trimethylolpropane triacrylate, glycidyl acrylate, isodecyl acrylate, dipentaerythritol monohydroxypenta acrylate, pentaerythritol triacrylate, 2-(N,N-diethylamino)ethyl acrylate, hydroxy lower alkyl acrylates such as hydroxyethyl acrylate, hydroxypropyl acrylate, hydroxyhexyl acrylate, benzoyloxyalkyl acrylates such as benzoyloxyethyl acrylate and benzoyloxyhexyl acrylate, cyclohexyl acrylate, n-hexyl acrylate, dicyclopentenylacrylate, N-vinyl-2-pyrrolidone isobornyl acrylate, isooctyl acrylate, n-lauryl acrylate, 2-butoxyethyl acrylate, 2-ethylhexyl acrylate, 2,2-methyl-(1,3-dioxolan-4-yl)methyl acrylate.

Monofunctional acrylates should be of higher molecular weight and therefore of lower volatility. As can be seen from the above list, the alkyl moiety of the acrylate can be substituted with virtually any inert organic group so long as the resultant acrylate remains liquid at room temperature and is miscible in the above described acrylated oligomers. In some embodiments the alkyl acrylate combination is dicyclopentenyloxyethyl acrylate and tripropyleneglycol diacrylate.

E. Additives

In addition to the above-described primary constituents, the composition of the invention may also contain various secondary materials to add to or enhance its properties such as elastomeric polymers, free radical initiators to render the composition curable either thermally or by UV light, pigments (soluble or insoluble) and various printing aids such as leveling agents, antifoam agents and thickeners. These materials are well known in the art. Typically the amount of photoinitiator used is from 0.1 to 10 wt %, based on the total weight of the dielectric composition. Typically the amount of printing aid used is from 0.1 to 2.0 wt %, based on the total weight of the dielectric composition.

F. Formulation

The compositions of the invention are not difficult to formulate and simple low energy mixing is sufficient to facilitate solution. While it is necessary that the compositions form stable admixtures, it is not necessary that the compositions be completely soluble in each other. In fact, some immiscibility of these blends was anticipated, which upon UV curing leads to microscopic phase separation and hence to a multiple phase structure.

G. Test Procedures

ITO-sputtered Polyester film substrates employed for adhesion testing are commercially available as 5 mil thick films. The grade evaluated is specified in the Examples.

Prints measuring 1 square inch were made through a 280-mesh stainless steel screen to give 1 to 1.1 mil (25.4 to 27.9 microns) thick test patterns.

Adhesion results reported refer to Crosshatch adhesion run according to ASTM D3359-78 using Method B 65 in which a lattice pattern of 11 cuts in each direction is made in the dielectric to the substrate, pressure-sensitive tape is applied over the lattice and then removed and the adhesion rated by the degree of removal according to the following scale:

5B The edges of the cuts are completely smooth; none of the squares of the lattice is detached.

4B Small flakes of the coating are detached at intersections; less than 5% of the area is affected.

3B Small flakes of the coating are detached along edges and at intersections of cuts. The area affected is 5 to 15% of the lattice.

2B The coating has flaked along the edges and on parts of the squares. The area affected is 15 to 35% of the lattice.

1B The coating has flaked along the edges of cuts in large ribbons and whole squares have detached. The area affected is 35 to 65% of the lattice.

OB Flaking and detachment worse than Grade 1 B.

All adhesion tests were run with 1 inch wide 3M Scotch® tape #600 using a Cross Hatch Cutter from the Gardner/Neotec Instrument Division of Pacific Scientific with a medium blade (eleven teeth with 1.5 mm spacings).

All dielectric prints were cured under untraviolet light on an RFC Industries QC®(8) Processor Model 1202 AN containing two 200 W/linear inch (79 W/linear cm) medium pressure mercury vapor light bulbs, running at 40 ft/min (20.3 cm/sec); the samples were cured in air approximately 3 inches from the lamps.

EXAMPLES

Three compositions were prepared. Example 1 was a dielectric composition of the invention containing 28.29 wt % talc and 2 wt % phosphoric acid. Comparative Experiment 1 had all the ingredients of the dielectric composition of the invention except it contained no phosphoric acid. Comparative Experiment 2 had all the ingredients of the dielectric composition of the invention including, like Example 1, 28.29 wt % talc but contained only 0.5 wt % phosphoric acid.

Example 1

A UV curable mixture was made from 37.83 wt % of an acrylated urethane resin (obtained from Cytec, Inc.), 26.86 wt % of dicyclopentenyloxyethyl acrylate, 0.11 wt % of a pre-dispersed copper phthalocyanine pigment in trimethylolpropane triacrylate (20:80), 3.24 wt % of 2-hydroxy-2-methyl-lphenyl-1-propanone, 0.69 wt % of 2,2-diethoxyacetophenone, 0.98 wt % of a silicone printing aid, 28.29 wt % talc, and 2.0% phosphoric acid additive (obtained from Cytec Inc. as Ebecryl 168). After mixing all the ingredients together, adhesion test parts were printed and cured as specified above on both 5 mil thick 80 ohm and 200 ohm ITO-sputtered polyester obtained from Courtaulds, Inc. Using the Crosshatch scale, adhesion values of 5B were obtained indicating no material removal, i.e. excellent adhesion.

Comparative Experiment 1

A UV curable mixture was made from 38.59 wt % of an acrylated urethane resin (obtained from Cytec, Inc.), 27.40 wt % of dicyclopentenyloxyethyl acrylate (obtained from Hitachi Chemical as FA-512A), 0.11 wt % of a predispersed copper phthalocyanine pigment in trimethylolpropane triacrylate (20:80), 3.30 wt % of 2-hydroxy-2-methyl-lphenyl-1-propanone (obtained from Ciba-Geigy as Darocur 1173), 0.70 wt % of 2,2-diethoxyacetophenone (obtained as 2,2-DiethoxyAcetophenone from First Chemical Corp.), 1.0 wt % of a silicone printing aid, and 28.90 wt % talc (obtained from Luzenac America, Inc). After mixing all the ingredients together, adhesion test parts were printed and cured as specified above on 5 mil thick 80 ohm and 200 ohm ITO-sputtered Polyester obtained from Courtaulds, Inc. Using the crosshatch scale, adhesion values of 2 B were obtained indicating significant material removal, i.e., poor adhesion.

Comparative Experiment 2

A UV curable mixture was made from 39.33 wt % of an acrylated urethane resin (obtained from Cytec, Inc.), 26.86 wt % of dicyclopentenyloxyethyl acrylate, 0.11 wt % of a pre-dispersed copper phthalocyanine pigment in trimethylolpropane triacrylate (20:80), 3.24 wt % of 2-hydroxy-2-methyl-(phenyl-1-propanone, 0.69 wt % of 2,2-diethoxyacetophenone, 0.98 wt % of a silicone printing aid, 28.29 wt % talc, and 0.5% phosphoric acid additive (obtained from Cytec Inc. as Ebecryl 168). After mixing all the ingredients together, adhesion test parts were printed and cured as specified above on both 5 mil thick 80 ohm and 200 ohm ITO-sputtered Polyester obtained from Courtaulds, Inc. Using the crosshatch scale, adhesion values of 2 B were obtained indicating material removal, i.e. poor adhesion.

What is claimed is:

1. A screen printable, curable dielectric composition comprising:
   a) 25 to 35 wt % finely divided talc particles; and
   b) a liquid component comprising:
      (1) 20 to 50 wt % acrylated urethane resin oligomer;
      (2) 15 to 40 wt % alkyl acrylate; and
      (3) 1 to 5 wt % phosphoric acid,
   wherein said talc particles are dispersed in said liquid component and wherein the wt % are based on the total weight of said dielectric composition.

2. The dielectric composition of claim 1, further comprising 0.1 to 10 wt % photoinitiator whereby said dielectric composition is UV curable.

3. The dielectric composition of claim 1, further comprising 0.1 to 2.0 wt % of a printing aid.

4. The dielectric composition of claim 1 wherein the amount of phosphoric acid is 1.5 to 2.5 wt %.

5. The dielectric composition of claim 1, wherein the amount of phosphoric acid is about 2 wt %.

6. The dielectric composition of claim 1, wherein the amount of acrylated urethane resin oligomer is 30 to 40 wt %.

7. The dielectric composition of claim 1, wherein the amount of alkyl acrylate is 20 to 30 wt %.

8. A touch screen display comprising a dielectric on an ITO or metal oxide substrate, said dielectric consisting of the cured dielectric composition of claim 1.

9. A touch screen display comprising a dielectric on an ITO or metal oxide substrate, said dielectric consisting of the cured dielectric composition of claim 2.

10. A thin-film photovoltaic cell comprising a dielectric on an ITO or metal oxide substrate, said dielectric consisting of the cured dielectric composition of claim 1.

11. A thin-film photovoltaic cell comprising a dielectric on an ITO or metal oxide substrate, said dielectric consisting of the cured dielectric composition of claim 2.

* * * * *